(12) United States Patent
Sato

(10) Patent No.: US 8,279,398 B2
(45) Date of Patent: Oct. 2, 2012

(54) DEFORMING MECHANISM, EXPOSURE APPARATUS, AND DEVICE MANUFACTURING METHOD

(75) Inventor: Takeshi Sato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 556 days.

(21) Appl. No.: 12/481,101

(22) Filed: Jun. 9, 2009

(65) Prior Publication Data

US 2009/0310107 A1 Dec. 17, 2009

(30) Foreign Application Priority Data

Jun. 11, 2008 (JP) .................................. 2008-153396
Jun. 5, 2009 (JP) .................................. 2009-135825

(51) Int. Cl.
*G03B 27/68* (2006.01)
*G03B 27/52* (2006.01)

(52) U.S. Cl. ............ 355/52; 355/55; 359/811; 359/813; 359/819; 359/822; 359/824; 359/818

(58) Field of Classification Search ............. 355/67–71, 355/52, 55; 359/811, 813, 819, 822
See application file for complete search history.

(56) References Cited

U.S. PATENT DOCUMENTS

| 5,264,966 A | 11/1993 | Okada et al. .................. 359/696 |
| 6,307,688 B1 | 10/2001 | Merz et al. ..................... 359/819 |
| 6,388,823 B1 | 5/2002 | Gaber et al. .................. 359/819 |
| 2006/0139585 A1 | 6/2006 | Maria Van Der Wijst et al. |

FOREIGN PATENT DOCUMENTS

| JP | 2000-195788 | 7/2000 |
| JP | 2002-519843 | 7/2002 |

*Primary Examiner* — Toan Ton
*Assistant Examiner* — Michelle Iacoletti
(74) *Attorney, Agent, or Firm* — Fitzpatrick, Cella, Harper & Scinto

(57) ABSTRACT

A deforming mechanism for deforming a transmissive optical element comprises a rotation member configured to hold the optical element and to rotate around an axis parallel to a tangential line of a circumference of the optical element at a portion where the rotation member holds the optical element, so as to deform the optical element by the rotation, a torque generating unit configured to generate a torque to rotate the rotation member around the axis, a holding base, and an elastic member connecting the holding base to the torque generating unit.

9 Claims, 7 Drawing Sheets

DEFORMING MECHANISM, EXPOSURE APPARATUS, AND DEVICE MANUFACTURING METHOD

BACKGROUND OF THE INVENTION

1. Field of the Invention

The present invention relates to a deforming mechanism for deforming a transmissive optical element, an exposure apparatus including the deforming mechanism, and a device manufacturing method of manufacturing a device using the exposure apparatus.

2. Description of the Related Art

As a mechanism for correcting non-rotational symmetrical on-axis aberration of the projection optical system of an exposure apparatus, a deforming mechanism is conventionally used which corrects the aberration of the whole projection optical system by deforming a transmissive optical element included in it.

Japanese Patent Laid-Open No. 2002-519843 or 2000-195788 discloses a deforming mechanism which applies a translational force alone or both a translational force and a torque to two opposing portions of a transmissive optical element, thereby deforming it.

In the prior-art deforming mechanism for deforming the transmissive optical element, the translational force is transmitted to the light passing area of the optical element when deforming it. This causes birefringence, resulting in degradation in optical performance.

SUMMARY OF THE INVENTION

It is an object of the present invention to suppress degradation in optical performance caused by birefringence which occurs when a transmissive optical element deforms.

One of the aspects of the present invention provides a deforming mechanism for deforming a transmissive optical element comprising a rotation member configured to hold the optical element and to rotate around an axis parallel to a tangential line of a circumference of the optical element at a portion where the rotation member holds the optical element, so as to deform the optical element by the rotation, a torque generating unit configured to generate a torque to rotate the rotation member around the axis, a holding base, and an elastic member connecting the holding base to the torque generating unit.

Further features of the present invention will become apparent from the following description of exemplary embodiments with reference to the attached drawings.

DESCRIPTION OF THE EMBODIMENTS

A preferred embodiment of the present invention will now be described with reference to the accompanying drawings.

Figure 1:
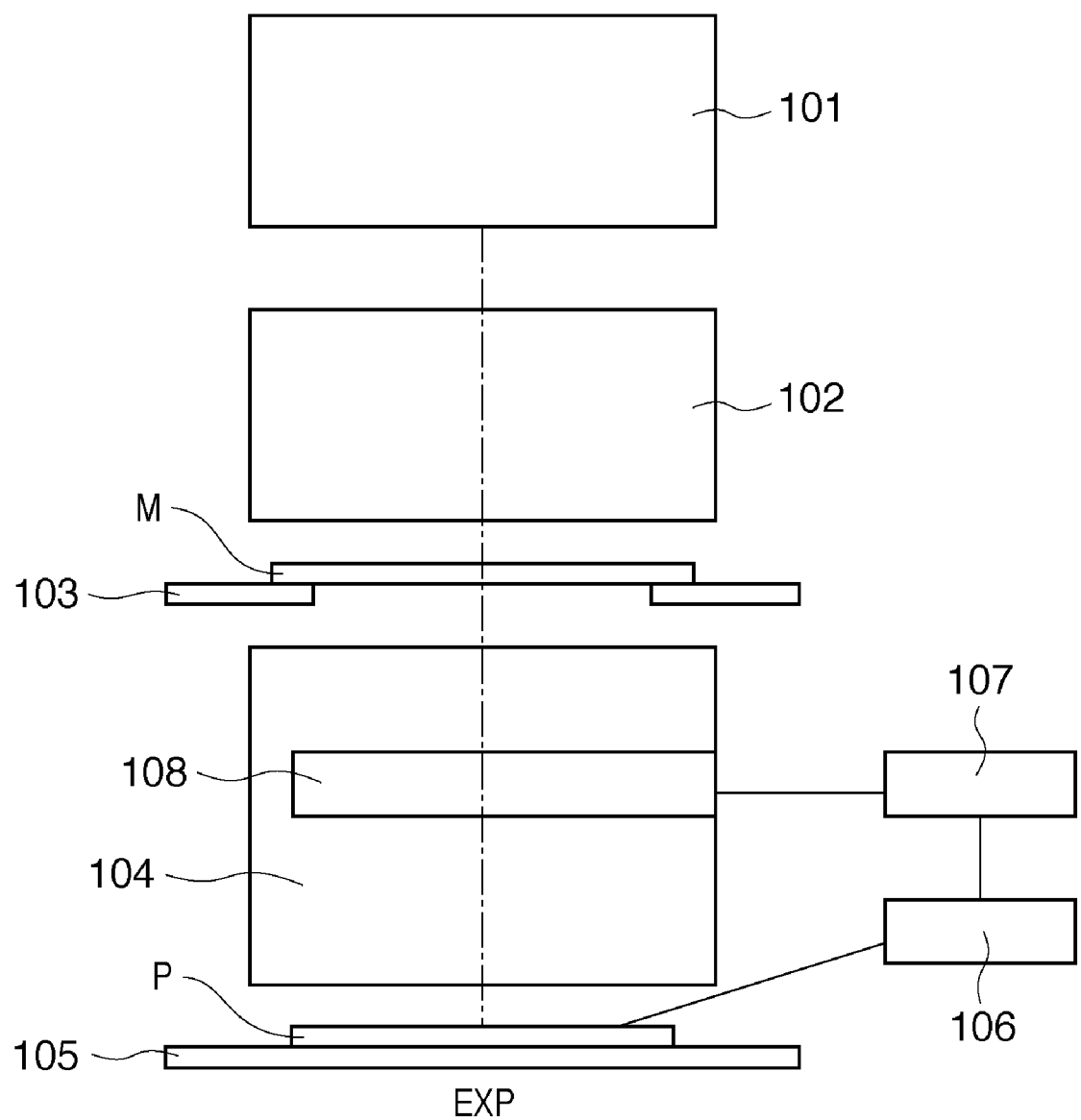
FIG. 1 is a view schematically showing the arrangement of an exposure apparatus according to a preferred embodiment of the present invention.

FIG. 1 is a view schematically showing the arrangement of an exposure apparatus according to a preferred embodiment of the present invention. An exposure apparatus EXP according to the preferred embodiment of the present invention includes a light source 101, illumination optical system 102, original stage 103, projection optical system 104, substrate stage 105, measurement device 106, and controller 107.

The illumination optical system 102 illuminates, using light generated by the light source 101, an original (reticle) M held on the original stage (reticle stage) 103. The projection optical system 104 includes at least one transmissive optical element. The transmissive optical element is typically a lens. Transmissive optical elements also include a flat optical element such as a plate glass with first and second parallel surfaces. The projection optical system 104 projects the pattern of the original M onto a substrate P held on the substrate stage 105. The projection optical system 104 may include a reflective optical element (mirror) in addition to at least one transmissive optical element. The substrate P can be, for example, a wafer or glass plate.

A deforming mechanism 108 for deforming the transmissive optical element is typically designed as part of the projection optical system 104. The deforming mechanism 108 deforms the transmissive optical element included in the projection optical system 104 in accordance with an instruction from the controller 107. The measurement device 106 measures aberration of the projection optical system 104 by evaluating an optical image formed on the substrate P, and sends the measurement result to the controller 107. Based on the measurement result received from the measurement device 106, the controller 107 determines an instruction to the deforming mechanism 108 to reduce the aberration of the projection optical system 104, and sends the instruction to the deforming mechanism 108.

Figure 2:
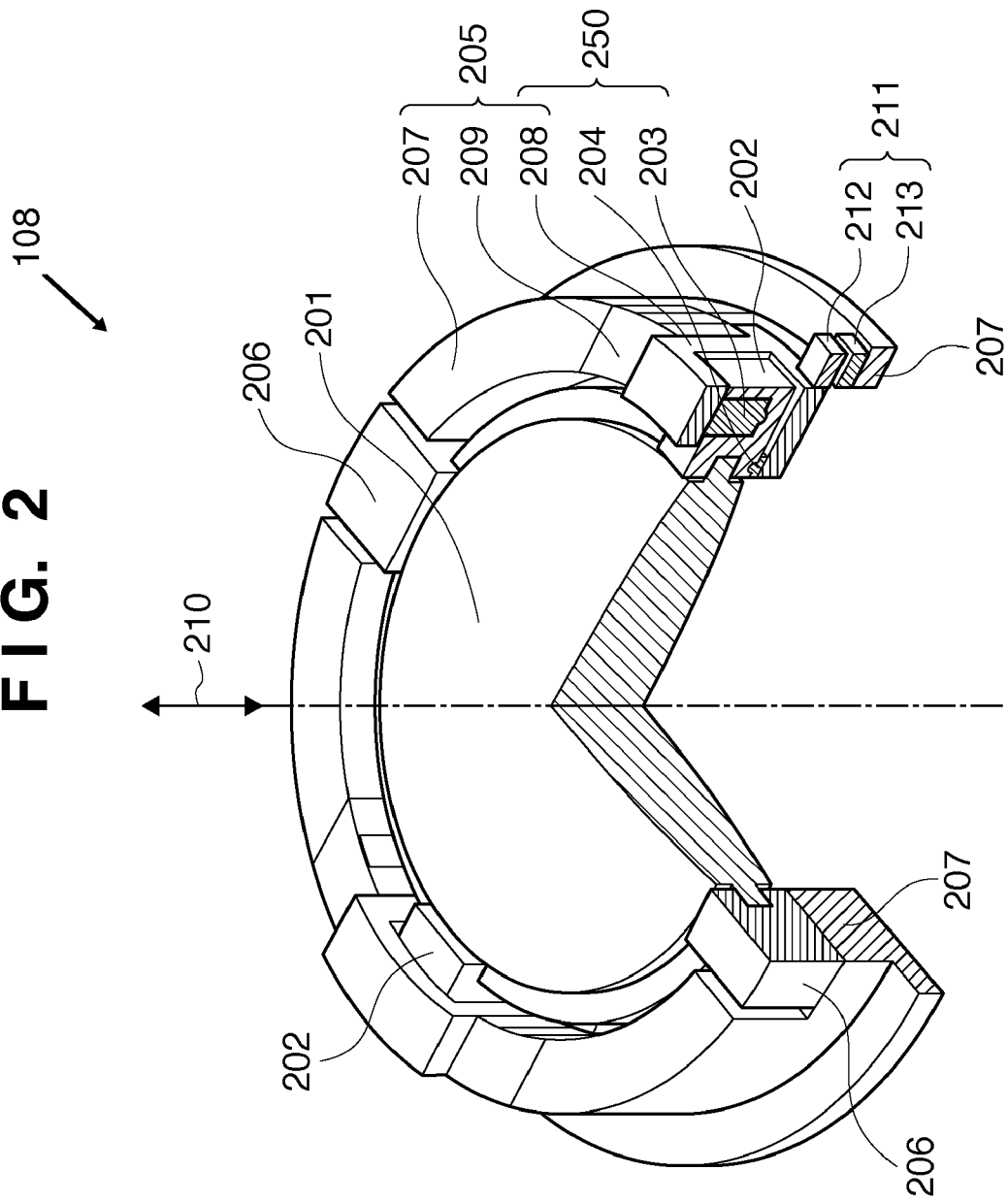
FIG. 2 is a view schematically showing the arrangement of a deforming mechanism according to the preferred embodiment of the present invention.

FIG. 2 is a view schematically showing the arrangement of the deforming mechanism 108 according to the preferred embodiment of the present invention. The deforming mechanism 108 can include, for example, a lens 201 that is a transmissive optical element, rotation members 202, an actuator 203 such as a piezoelectric actuator, a hemispherical member 204, a lens barrel 205 serving as an optical element support, lens holding members 206, and a capacitance sensor 211.

The lens barrel 205 can include a holding base 207, a torque generating unit base (base member) 208, and a parallel linkage 209 serving as an elastic member. The capacitance sensor 211 can include a target-side sensor 212 and a probe-side sensor 213.

In the example shown in FIG. 2, the actuator 203, hemispherical member 204, and torque generating unit base (base member) 208 form a torque generating unit 250 for generating a torque to rotate the rotation member 202 around the circumferential direction of the lens 201. The rotation member 202 is designed to be driven to rotate around the circumferential direction of the lens 201 by the torque generating unit 250 while holding the lens 201. In other words, the rotation member 202 is designed to hold the lens 201 and to be driven to rotate around an axis parallel to a tangential line of the circumference of the lens 201 at a portion where the rotation member 202 holds the lens 201. The lens 201 is deformed by the rotation of the rotation member.

The lens 201 is held by the two lens holding members 206 at two opposing points on its circumference. The holding base 207 holds the lens holding members 206. The lens 201 is also held by the two rotation members 202 at two opposing points on its circumference. The direction (opposing direction) of the first line connecting the two lens holding members 206 and the direction (opposing direction) of the second line connecting the two rotation members 202 are orthogonal to each other. The arrangements of the rotation members 202 and their vicinities are symmetrical with respect to the second line.

The rotation member 202 comes into contact with the actuator 203 and the hemispherical member 204 so as to be supported by them or take an attitude determined by them. The rotation member 202 has a conical concave shape at each of the two contact portions. Each of the actuator 203 and the hemispherical member 204 has a hemispherical convex shape at a corresponding portion. The two contact portions are located at different positions in the radial direction of the lens 201. More specifically, the rotation member 202 is supported by the torque generating unit base (base member) via the hemispherical member 204 at the first position in the radial direction of the lens 201, and is also supported by the actuator 203 at the second position in the radial direction. The actuator 203 applies a force along the optical axis direction to the rotation member 202 at the second position.

The torque generating unit base 208 holds the actuator 203 and the hemispherical member 204. The torque generating unit base 208 is connected to the holding base 207 via the parallel linkage 209 serving as an elastic member.

The target-side sensor 212 is fixed on the torque generating unit base 208. The probe-side sensor 213 is fixed on the holding base 207. An electrode formed on the surface of the target-side sensor 212 faces that formed on the surface of the probe-side sensor 213 on the holding base 207. The target-side sensor 212 and the probe-side sensor 213 are connected to the controller 107 via electrical cables (not shown). The actuator 203 is also connected to the controller 107 via another electrical cable (not shown). An arrow 210 in FIG. 2 indicates the optical axis direction of the lens 201.

Figure 3:
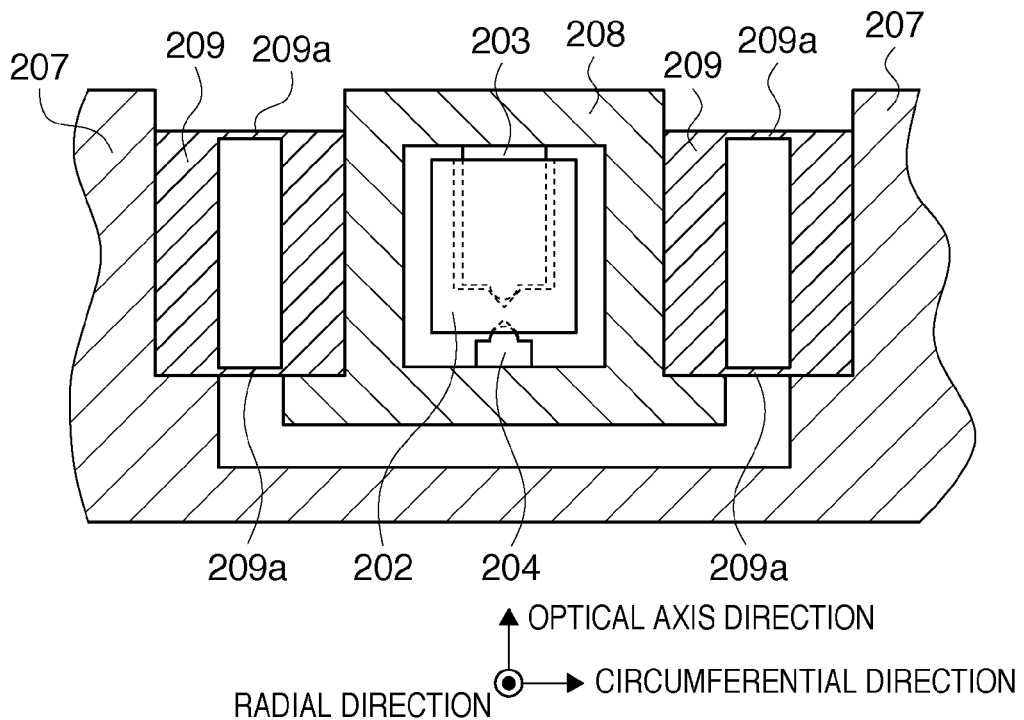
FIG. 3 is a sectional view showing the vicinity of a parallel linkage.

FIG. 3 is a view showing the vicinity of the parallel linkage 209. In FIG. 3 and other drawings, the optical axis direction indicates the optical axis direction of the lens 201, the radial direction indicates the radial direction about the optical axis of the lens 201, and the circumferential direction indicates a direction along the circumference of a circle about the optical axis of the lens 201. The parallel linkage 209 connects the holding base 207 to the torque generating unit 250 (torque generating unit base 208) while allowing the torque generating unit 250 to move along the optical axis direction of the lens 201. The parallel linkage 209 has, for example, two plate portions 209a parallel to a plane perpendicular to the optical axis direction of the lens 201. The rigidity of the parallel linkage 209 in the optical axis direction is lower than that in other directions including, for example, a direction around the circumferential direction, that is, a direction around the axis parallel to the tangential line of the circumference of the lens 201 at the portion where the rotation member 202 holds the lens 201. Each plate portion 209a functions as a leaf spring.

Referring back to FIG. 2, the deforming mechanism 108 causes the two lens holding members 206 to hold the lens 201 at two points on its circumference, and causes the two rotation members 202 to hold the lens 201 at two points on its circumference. However, the lens holding members 206 are not always necessary. The deforming mechanism 108 deforms the lens 201 in 2-fold rotational symmetry by making the two rotation members 202 apply, to the two points of the lens 201, torques in opposite directions around the circumferential direction. In this deformation, the lens 201 is displaced in the optical axis direction at the two points on its circumference held by the two rotation members 202. However, at the time of deformation, the lens 201 receives no translational forces except that for supporting its weight. In other words, the translational force applied to the lens 201 via the rotation members 202 does not change before and after the deformation (i.e., before and after the change in the torque generated by the torque generating unit 250).

Figure 4:
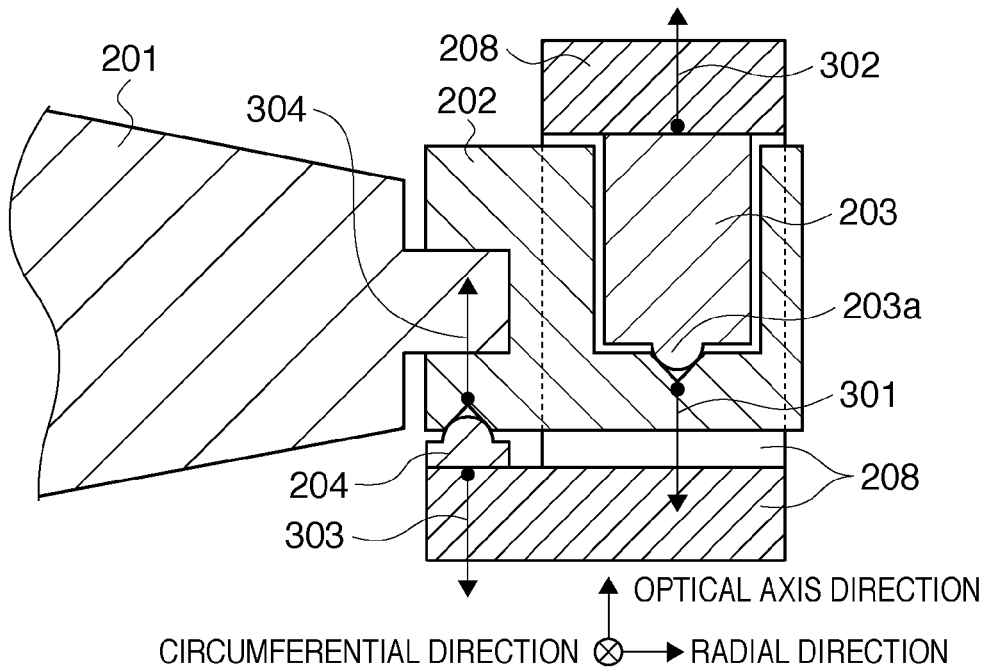
FIG. 4 is a sectional view of a rotation member and its vicinity.

FIG. 4 is a sectional view of the rotation member 202 and its vicinity. A method of applying a torque to the lens 201 will be explained with reference to FIG. 4. The actuator 203 is assumed to be a piezoelectric actuator here. However, the actuator 203 may be of any other type.

When expanding, the actuator 203 applies a translational force 301 to the rotation member 202 via a hemispherical portion 203a at an end, and simultaneously applies a translational force 302 as a reaction force to the torque generating unit base 208 at the other end. Upon receiving the translational force 301, the rotation member 202 applies a translational force 303 having almost the same direction and magnitude as the translational force 301 to the torque generating unit base 208 via the hemispherical member 204, and simultaneously receives a translational force 304 as a reaction force from the hemispherical member 204. With the translational forces 301, 302, 303, and 304, the rotation member 202 and the torque generating unit base 208 apply torques around the circumferential direction of the lens 201 to each other via the actuator 203 and the hemispherical member 204. The torque that the rotation member 202 applies to the lens 201 deforms it. Since the two rotation members 202 apply torques to the lens 201 in opposite directions, the deformation of the lens 201 has 2-fold rotational symmetry.

The deformation amount of the lens 201 is determined by the ratio of the torque rigidity of the lens 201 connected to the rotation members 202 to that of the parallel linkage 209 (see FIG. 3) connected to the torque generating unit base 208. As the torque rigidity of the parallel linkage 209 decreases, the torque applied to the rotation member 202 becomes large, and the lens 201 deforms greatly.

When the lens 201 deforms by expansion of the actuator 203, the portion held by the rotation member 202 is prone to downward displacement in FIG. 4. Sufficiently reducing the rigidity of the parallel linkage 209 in the optical axis direction suppresses the impediment to deformation of the lens 201. If the rigidity of the parallel linkage 209 in the optical axis direction is low enough, the change in the force applied to the lens 201 before and after the deformation occurs only for the torque around the circumferential direction of the lens 201 but is approximately zero for the translational forces.

Figure 5:
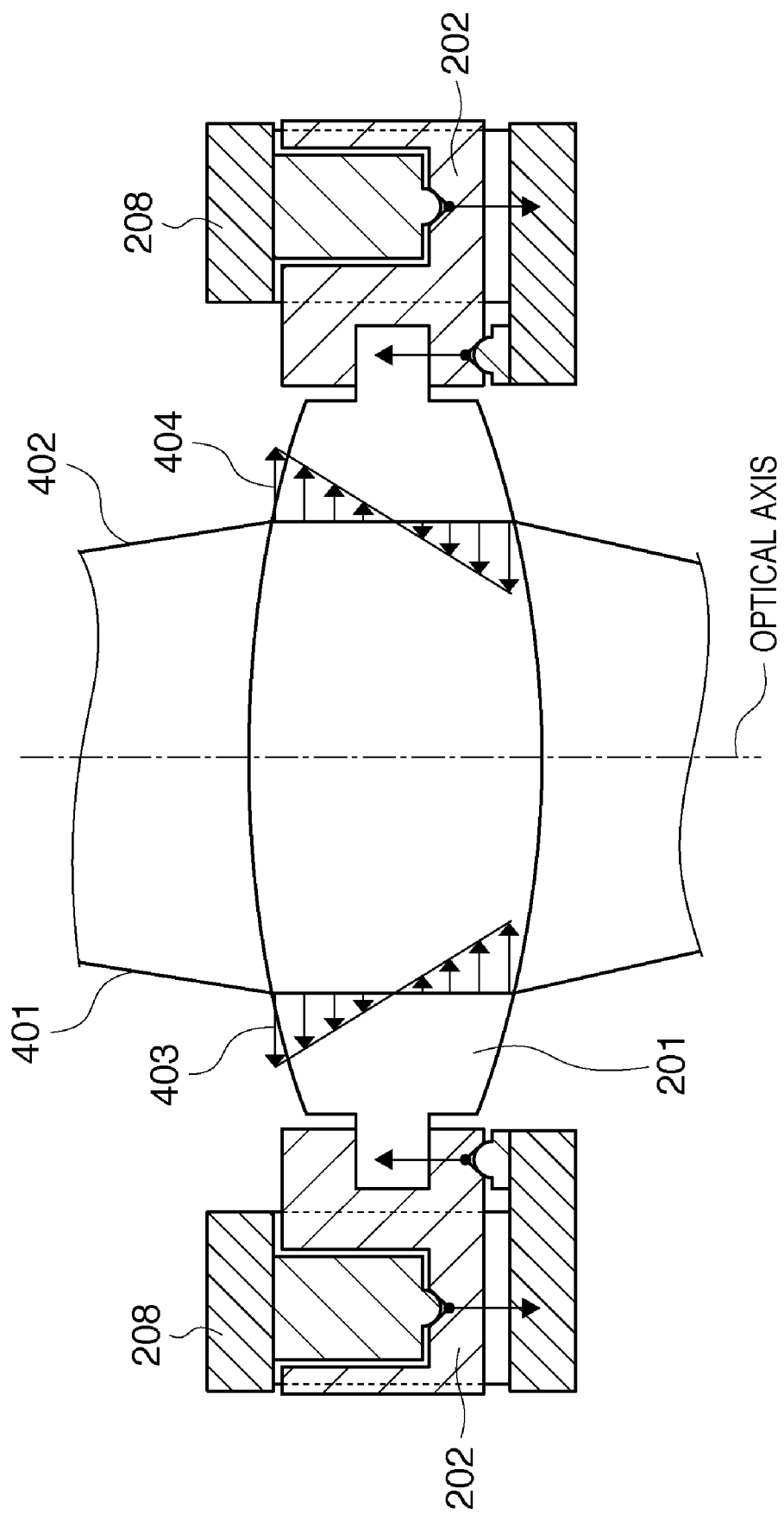
FIG. 5 is a sectional view of rotation members and a lens.

FIG. 5 is a sectional view of the rotation members 202 and the lens 201. FIG. 5 illustrates light beams 401 and 402 passing through the lens 201, and stress distributions 403 and 404 generated in the optical paths of the light beams 401 and 402 upon deformation of the lens 201. As described above, the force transmitted to the lens 201 includes almost only the torque around the circumferential direction of the lens at each position where the rotation member 202 holds the lens 201. Hence, the stress distributions 403 and 404 include almost only the radial components of the lens 201. The magnitudes of the stress distributions 403 and 404 are zero near the center of the lens 201 in the thickness direction. On the upper surface of the lens 201, the stress becomes maximum in directions in which the lens 201 expands in the radial directions. On the lower surface of the lens 201, the stress becomes maximum in directions in which the lens 201 contracts in the radial directions.

In the area where such stress is generated, birefringence occurs in the lens 201. The magnitude of the birefringence is nearly proportional to that of the stress. The fast axis direction of the birefringence rotates by 90° in accordance with the direction of the stress. For this reason, birefringence on the upper side and that on the lower side cancel each other so that the total magnitude is approximately zero. The light beams in FIG. 5 are parallel to the optical axis in the lens 201. Note that almost the same effect as described above can be obtained even if the light beams are roughly parallel to the optical axis in the lens 201.

The deformation amount of the lens 201 can be represented by the displacement of the torque generating unit base 208 in the optical axis direction. The deformation amount of the lens 201 is represented by the optical-axis displacement of the torque generating unit base 208 in the optical axis direction with the target-side sensor 212 being attached. When the lens 201 deforms, the holding base 207 with the probe-side sensor 213 being attached is not displaced in the optical axis direction. Hence, the deformation amount of the lens 201 can be calculated based on the distance between the electrode of the target-side sensor 212 and that of the probe-side sensor 213, that is, the output from the capacitance sensor 211. The controller 107 receives the signal output from the capacitance sensor 211 via the electrical cable, and converts the output signal into a deformation amount of the lens 201 using an internal conversion table. The controller 107 applies a voltage serving as an instruction value to the actuator 203 via another electrical cable. If the deformation amount of the lens 201 is different from the target value, the voltage to be applied to the actuator 203 is adjusted. Note that a sensor of another type may be used in place of the capacitance sensor 211.

When deforming the lens 201, the torque generating unit base 208 tilts only slightly. Hence, using the displacement of the torque generating unit base 208 in the optical axis direction as an index representing the deformation amount of the lens 201 is suitable for preventing any increase in detection errors caused by the tilt of the capacitance sensor 211. Displacement of the rotation member 202 or parallel linkage 209 in the optical axis direction, the expansion amount of the actuator 203, distortion of the parallel linkage 209, and the like are also usable as the index. That is, the target-side sensor 212 may be attached to the rotation member 202 or parallel linkage 209. A strain gauge may be employed as the sensor, and attached to the actuator 203 or parallel linkage 209 to detect its deformation amount. The probe-side sensor 213 is attachable to any position where it is displaced in an amount smaller than the displacement of the torque generating unit base 208 in the optical axis direction when the lens 201 deforms. For example, probe-side sensor 213 may be arranged on a reference member provided independently of the deforming mechanism 108.

The rotation members 202 hold the lens 201 using an adhesive, a mechanical clamping structure, or any other method. The force transmission loss between the rotation members and the lens is preferably as small as possible. For example, to bond them, the adhesive is preferably applied not to one point but to several points in the contact area, or to a large area. A mechanical clamping structure preferably holds the lens at several points or by a wide surface. The rotation members and the lens may be integrated.

Figure 6:
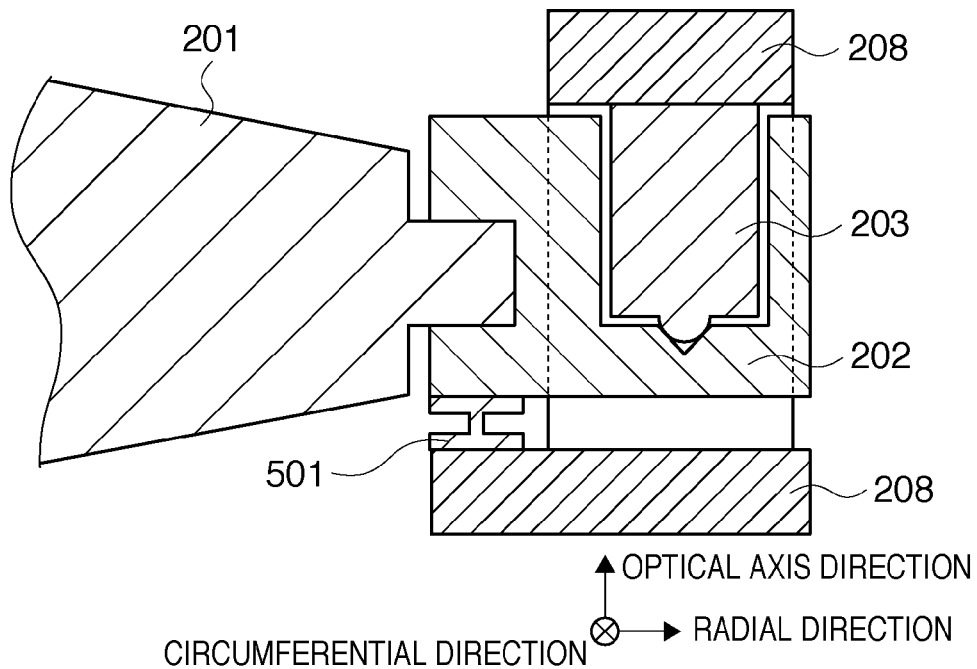
FIG. 6 is a sectional view schematically showing the arrangement of the deforming mechanism according to the preferred embodiment of the present invention.

In this embodiment, at the contact portion between the torque generating unit and the rotation member, the torque generating unit has a hemispherical convex shape, and the rotation member has a conical concave shape. However, the contact portion need not always have such a structure. For example, the torque generating unit may have a conical concave shape, whereas the rotation member may have a hemispherical convex shape. Any other structure is also applicable as far as it can reduce moment transmission between the torque generating unit and the rotation member. For example, as shown in FIG. 6, an elastic hinge 501 may be adopted as one component of the torque generating unit in place of the hemispherical member 204. The elastic hinge 501 makes the portion that slides during the operation of the actuator 203 smaller. Hence, the durability rises.

Figure 7:
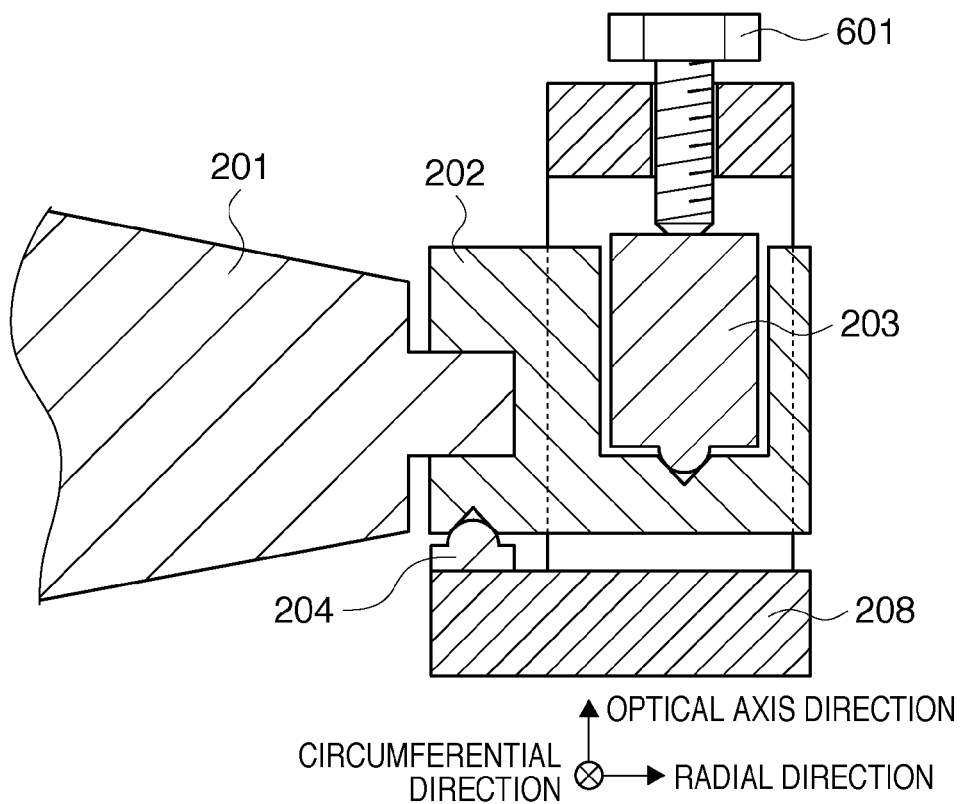
FIG. 7 is a sectional view schematically showing the arrangement of the deforming mechanism according to the preferred embodiment of the present invention.

Instead of the torque generating unit including the actuator and the hemispherical member or elastic hinge, a torque generating unit including a component such as a pressure bellows or screw feed mechanism may be employed. A torque generating unit including any other mechanism is usable. A screw feed mechanism is poorer than an actuator such as a piezoelectric actuator in response and accuracy but superior in stroke, and is therefore optimum for coarsely adjusting the shape of the transmissive optical element. More preferably, a screw feed mechanism 601 and the actuator 203 are arranged in tandem, as shown in FIG. 7, so as to combine their advantages.

The hemispherical member 204 may be replaced with an additional piezoelectric actuator so that two piezoelectric actuators are arranged per rotation member 202.

The parallel linkage 209 may be removed from the arrangement shown in FIGS. 2 to 4 to directly connect the holding base 207 and the torque generating unit base 208. In this case, the two piezoelectric actuators respectively press the rotation members 202 to apply torques to them. Simultaneously, a small difference is generated between the press forces, thereby applying auxiliary translational forces in the optical axis direction to the rotation members 202. This makes it possible to adjust the deformation profile in the radial direction of the lens 201.

The parallel linkage 209 has low rigidity both in the optical axis direction of the lens 201 and in the direction of the force generated by each element (e.g., actuator 203) of the torque generating unit. The former feature effectively suppresses the impediment, by the rigidity of the holding base 207 in the optical axis direction, to the deformation of the lens 201 by the torque generated from the torque generating unit. The latter feature effectively suppresses transmission of the translational force generated by the torque generating unit to the lens 201. The rigidity of the parallel linkage 209 is preferably much smaller than the rigidity of the lens 201 against bending.

Figure 8:
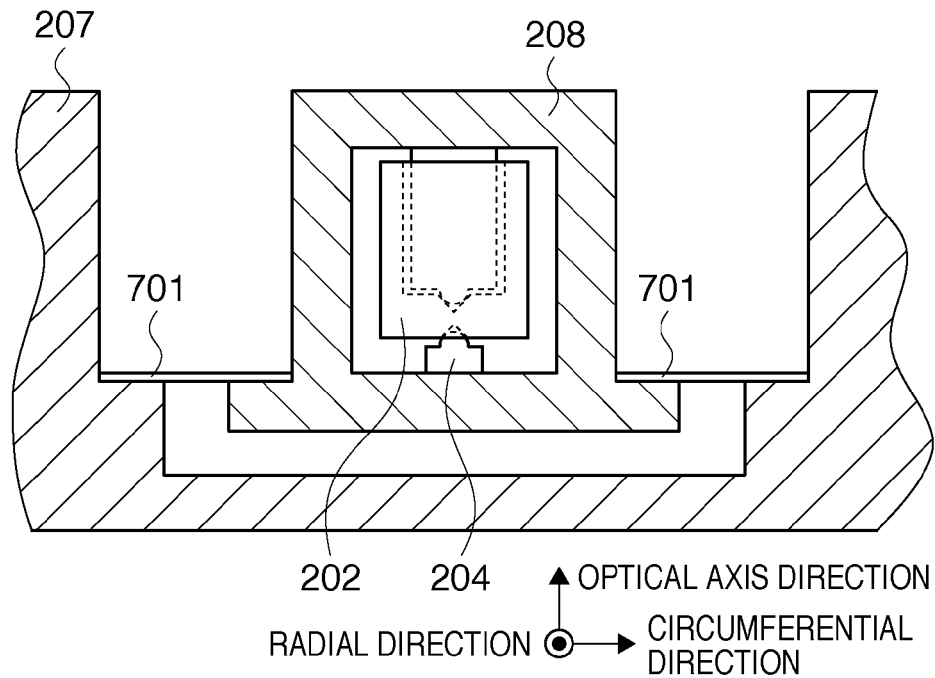
FIG. 8 is a sectional view schematically showing the arrangement of the deforming mechanism according to the preferred embodiment of the present invention.

A leaf spring 701 as shown in FIG. 8 may be used as the elastic member. The leaf spring 701 connects the holding base 207 to the torque generating unit 250 (torque generating unit base 208) while allowing the torque generating unit 250 to move along the optical axis direction of the lens 201. The leaf spring 701 has, for example, a plate portion parallel to a plane perpendicular to the optical axis direction of the lens 201. This structure reduces the rigidity of the leaf spring 701 against the torque around the circumferential direction and decreases the deformation amount of the lens 201 with respect to the expansion amount of the actuator 203. It is therefore possible to accurately control the shape of the lens 201.

Figure 9:
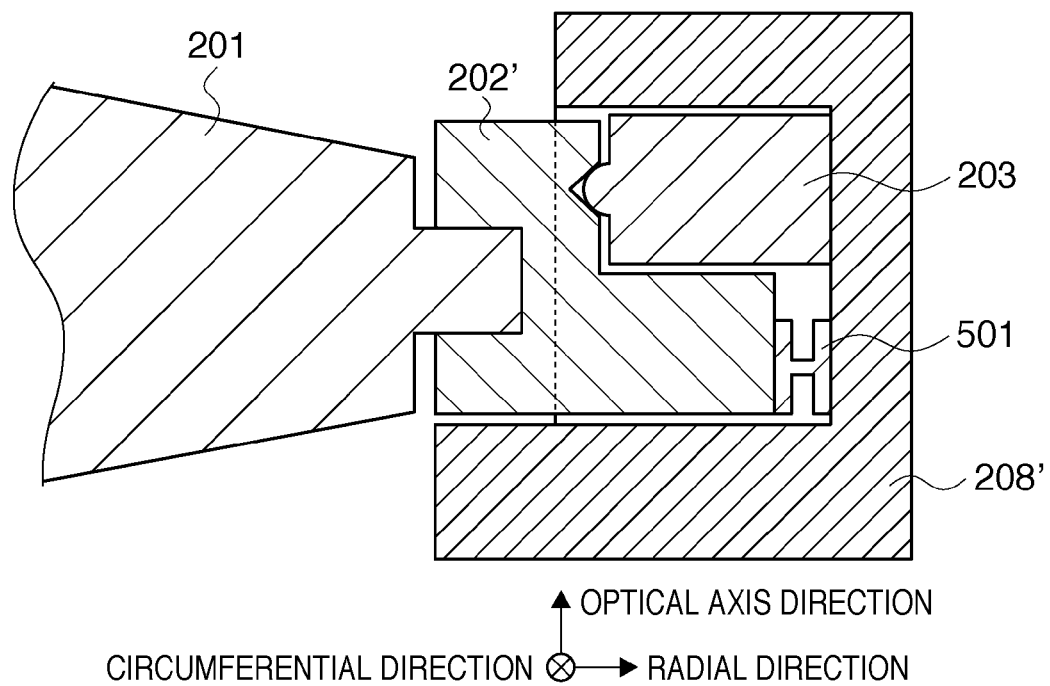
FIG. 9 is a sectional view schematically showing the arrangement of the deforming mechanism according to the preferred embodiment of the present invention.

FIG. 9 is a sectional view showing a modification of the arrangement of the torque input and its vicinity. As shown in FIG. 9, the actuator 203 and the elastic hinge 501, which are constituent elements of the torque generating unit, are arranged to apply a force to a rotation member 202' in the radial direction. Accordingly, in the modification shown in FIG. 9, the rotation member 202' and a torque generating unit base 208' have shapes different from those of the rotation member 202 and the torque generating unit base 208.

The parallel linkage 209 preferably has low rigidity both in the optical axis direction of the lens 201 and in the radial direction of the lens 201, that is, in the direction of the force generated by the actuator 203 that is a constituent element of the torque generating unit. This arrangement facilitates adding, to the deforming mechanism 108, a mechanism for exchanging the actuator 203 from outside in the radial direction in case of, for example, breakdown.

In the above embodiment, two rotation members are arranged at two positions to divide the circumference of the lens 201 into two equal parts. This arrangement is suitable for deforming the lens 201 in 2-fold rotational symmetry. However, the arrangement of the rotation members of the present invention is not limited to this. For example, three rotation members may be arranged at three portions to divide the circumference of the lens into three equal parts, or four rotation members may be arranged at four portions to divide the circumference of the lens into four equal parts. These arrangements are suitable for deforming the lens in 3- and 4-fold rotational symmetry. Any other arrangement may be adopted in accordance with a desired lens deformation method.

As described above, according to the deforming mechanism of the preferred embodiment of the present invention, it is possible to suppress degradation in optical performance caused by birefringence which occurs when a transmissive optical element deforms.

Figure 10:
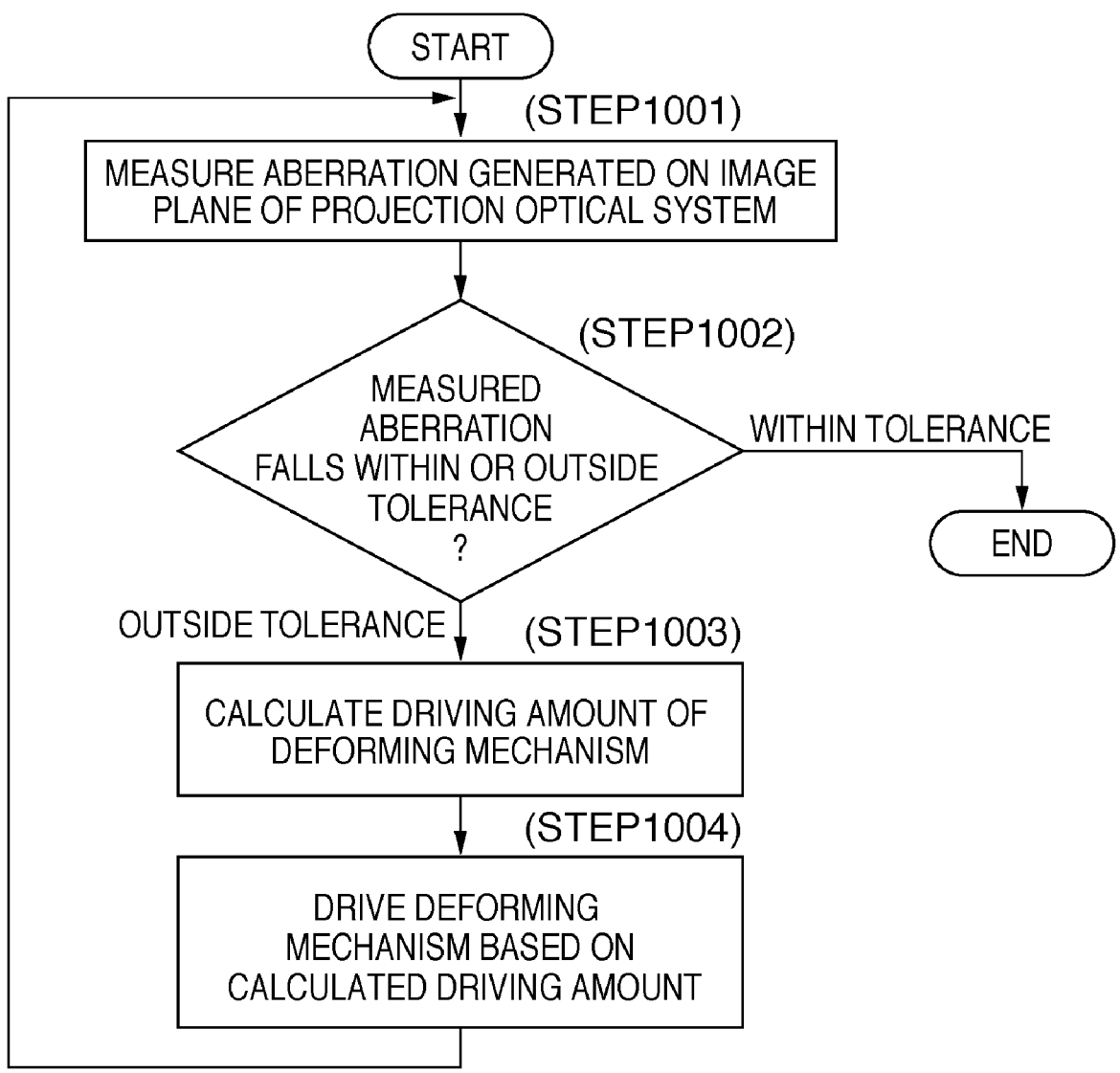
FIG. 10 is a flowchart illustrating an example of an aberration correction method to which the present invention is applicable.

FIG. 10 is a flowchart illustrating aberration correction processing according to the preferred embodiment of the present invention. In the correction processing, the deforming mechanism 108 deforms a transmissive optical element (typically a lens) in the projection optical system 104, thereby correcting its aberration.

First, the measurement device 106 evaluates an image formed on the image plane of the projection optical system 104, thereby measuring the aberration of the projection optical system 104 (step 1001). Next, the controller 107 determines whether the measured aberration falls within or outside the tolerance (step 1002). If the measured aberration falls within the tolerance, the aberration correction processing ends. On the other hand, if the measured aberration falls outside the tolerance, the controller 107 calculates the driving amount of the deforming mechanism 108 necessary for reducing the aberration (step 1003). The deforming mechanism 108 is driven based on the calculated driving amount (step 1004). Then, the process returns to step 1001. The aberration of the projection optical system 104 can be reduced in this way.

A device manufacturing method of the present invention includes the steps of causing the exposure apparatus EXP to transfer the pattern of the original M onto a photoresist applied to the substrate P, and developing the photoresist. The term "device" includes, for example, a semiconductor device and a flat panel device (e.g., liquid crystal display device).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-153396, filed Jun. 11, 2008, and No. 2009-135825, filed Jun. 5, 2009, which are hereby incorporated by reference herein in their entirety.

What is claimed is:

1. A deforming mechanism for deforming a transmissive optical element, the mechanism comprising:
    a rotation member configured to hold the optical element and to rotate around an axis parallel to a tangential line of a circumference of the optical element at a portion where the rotation member holds the optical element, so as to deform the optical element by the rotation;
    a torque generating unit configured to generate a torque to rotate the rotation member around the axis;
    a holding base; and
    an elastic member connecting the holding base to the torque generating unit,
    wherein the torque generating unit includes:
    (a) a component configured to apply, to a first portion of the rotation member, a first force in a direction parallel to an optical axis of the optical element;
    (b) a base member configured to hold the component; and
    (c) a contact portion that is provided to the base member and that contacts with a second portion of the rotation member, the second portion being located apart from the first portion in a direction parallel to a radial direction of the optical element,
    wherein the second portion of the rotation member applies a second force to the contact portion as a result of the rotation member receiving the first force from the component, and the second portion of the rotation member receives a reaction force as a result of the rotation member applying the second force to the contact portion, and
    wherein the torque is generated only by the first force applied to the first portion of the rotation member and the reaction force applied to the second portion of the rotation member.

2. The mechanism according to claim 1, wherein the elastic member is configured to support the torque generating unit such that a translational force applied to the optical element via the rotation member does not change before and after a change in the torque generated by the torque generating unit.

3. The mechanism according to claim 1, wherein rigidity of the elastic member in an optical axis direction of the optical element is lower than rigidity around the axis parallel to the tangential line of the circumference of the optical element at the portion where the rotation member holds the optical element.

4. The mechanism according to claim 1, wherein the elastic member includes a parallel linkage which allows the torque generating unit to move along an optical axis direction of the optical element.

5. The mechanism according to claim 1, wherein the elastic member includes a leaf spring which allows the torque generating unit to move along an optical axis direction of the optical element.

6. The mechanism according to claim 1, wherein the component includes an actuator configured to generate a force to rotate the rotation member.

7. An exposure apparatus for projecting a pattern of an original onto a substrate via a projection optical system having a transmissive optical element to expose the substrate, the apparatus comprising:
a deforming mechanism configured to deform the transmissive optical element of the projection optical system, the mechanism comprising:
a rotation member configured to hold the optical element and to rotate around an axis parallel to a tangential line of a circumference of the optical element at a portion where the rotation member holds the optical element, so as to deform the optical element by the rotation;
a torque generating unit configured to generate a torque to rotate the rotation member around the axis;
a holding base; and
an elastic member connecting the holding base to the torque generating unit,
wherein the torque generating unit includes:
(a) a component configured to apply, to a first portion of the rotation member, a first force in a direction parallel to an optical axis of the optical element;
(b) a base member configured to hold the component; and
(c) a contact portion that is provided to the base member and that contacts with a second portion of the rotation member, the second portion being located apart from the first portion in a direction parallel to a radial direction of the optical element,
wherein the second portion of the rotation member applies a second force to the contact portion as a result of the rotation member receiving the first force from the component, and the second portion of the rotation member receives a reaction force as a result of the rotation member applying the second force to the contact portion, and
wherein the torque is generated only by the first force applied to the first portion of the rotation member and the reaction force applied to the second portion of the rotation member.

8. A device manufacturing method comprising:
causing an exposure apparatus to transfer a pattern of an original onto a photoresist applied to a substrate; and
developing the photoresist,
wherein the exposure apparatus is configured to project the pattern of the original onto the substrate via a projection optical system having a transmissive optical element to expose the substrate, the apparatus comprising
a deforming mechanism configured to deform the transmissive optical element of the projection optical system, the mechanism comprising:
a rotation member configured to hold the optical element and to rotate around an axis parallel to a tangential line of a circumference of the optical element at a portion where the rotation member holds the optical element, so as to deform the optical element by the rotation;
a torque generating unit configured to generate a torque to rotate the rotation member around the axis;
a holding base; and
an elastic member connecting the holding base to the torque generating unit,
wherein the torque generating unit includes:
(a) a component configured to apply, to a first portion of the rotation member, a first force in a direction parallel to an optical axis of the optical element;
(b) a base member configured to hold the component; and
(c) a contact portion that is provided to the base member and that contacts with a second portion of the rotation member, the second portion being located apart from the first portion in a direction parallel to a radial direction of the optical element,
wherein the second portion of the rotation member applies a second force to the contact portion as a result of the rotation member receiving the first force from the component, and the second portion of the rotation member receives a reaction force as a result of the rotation member applying the second force to the contact portion, and
wherein the torque is generated only by the first force applied to the first portion of the rotation member and the reaction force applied to the second portion of the rotation member.

9. A deforming mechanism for deforming a transmissive optical element, the mechanism comprising:
a rotation member configured to hold the optical element and to rotate around an axis parallel to a tangential line of a circumference of the optical element at a portion where the rotation member holds the optical element, so as to deform the optical element by the rotation;
a torque generating unit configured to generate a torque to rotate the rotation member around the axis;
a holding base; and
an elastic member connecting the holding base to the torque generating unit,
wherein the torque generating unit includes:
(a) a component configured to apply, to a first portion of the rotation member, a first force in a direction parallel to a radial direction of the optical element;
(b) a base member configured to hold the component; and
(c) a contact portion that is provided to the base member and that contacts with a second portion of the rotation member, the second portion being located apart from the first portion in a direction parallel to an optical axis of the optical element,
wherein the second portion of the rotation member applies a second force to the contact portion as a result of the rotation member receiving the first force from the component, and the second portion of the rotation member receives a reaction force as a result of the rotation member applying the second force to the contact portion, and
wherein the torque is generated only by the first force applied to the first portion of the rotation member and the reaction force applied to the second portion of the rotation member.

\* \* \* \* \*